United States Patent
Khouri et al.

(10) Patent No.: US 7,020,014 B2
(45) Date of Patent: Mar. 28, 2006

(54) CIRCUIT AND METHOD FOR TEMPERATURE TRACING OF DEVICES INCLUDING AN ELEMENT OF CHALCOGENIC MATERIAL, IN PARTICULAR PHASE CHANGE MEMORY DEVICES

(75) Inventors: Osama Khouri, Milan (IT);
Ferdinando Bedeschi, Taranto (IT);
Claudio Resta, Villa di Tirano (IT)

(73) Assignees: STMicroelectronics S.r.l., Agrate Brianza (IT); Ovonyx, Inc., Boise, ID (US)

( * ) Notice: Subject to any disclaimer, the term of this patent is extended or adjusted under 35 U.S.C. 154(b) by 92 days.

(21) Appl. No.: 10/715,883

(22) Filed: Nov. 18, 2003

(65) Prior Publication Data
US 2004/0151023 A1     Aug. 5, 2004

(30) Foreign Application Priority Data
Nov. 18, 2002    (EP) ............................ 02425706

(51) Int. Cl.
*G11C 11/00*    (2006.01)

(52) U.S. Cl. ................. 365/163; 365/148; 365/164; 365/174

(58) Field of Classification Search ................. 365/163, 365/148, 164, 174
See application file for complete search history.

(56) References Cited

U.S. PATENT DOCUMENTS

| | | | |
|---|---|---|---|
| 6,816,404 B1 * | 11/2004 | Khouri et al. | ............... 365/163 |
| 2001/0009528 A1 | 7/2001 | Cooper et al. | ............... 365/212 |

FOREIGN PATENT DOCUMENTS

SU    522523    9/1976

* cited by examiner

*Primary Examiner*—Richard Elms
*Assistant Examiner*—Pho M. Luu
(74) *Attorney, Agent, or Firm*—Lisa K. Jorgenson; Robert Iannucci; Seed IP Law Group PLLC

(57) ABSTRACT

A phase change memory includes a temperature sensor having a resistance variable with temperature with the same law as a phase-change storage element. The temperature sensor is formed by a resistor of chalcogenic material furnishing an electrical quantity that reproduces the relationship between the resistance of a phase change memory cell and temperature; the electrical quantity is processed so as to generate reference quantities as necessary for writing and reading the memory cells. The chalcogenic resistor has the same structure as a memory cell and is programmed with precision, preferably in the reset state.

31 Claims, 7 Drawing Sheets

CIRCUIT AND METHOD FOR TEMPERATURE TRACING OF DEVICES INCLUDING AN ELEMENT OF CHALCOGENIC MATERIAL, IN PARTICULAR PHASE CHANGE MEMORY DEVICES

BACKGROUND OF THE INVENTION

1. Field of the Invention

The present invention relates to a circuit and a method for temperature tracing of devices including an element of chalcogenic material, in particular of phase change memory devices.

2. Description of the Related Art

As is known, phase change memory devices comprise storage elements made of a class of materials that have the unique property of being reversibly switchable from one phase to another with measurable distinct electrical properties associated with each phase. For example, these materials may change between an amorphous disordered phase and a crystalline, or polycrystalline, ordered phase. A material property that may change and provide a signature for each phase is the material resistivity, which is considerably different in the two states.

Specific materials that may be suitably used in phase change cells are alloys of elements of the VI group of the periodic table as Te or Se, also called chalcogenides or chalcogenic materials. Therefore, hereinafter, the term "chalcogenic materials" is used to indicate all materials switcheable between at least two different phases where they have different electrical properties (resistances) and include thus the elements of the VI group of the periodic table and their alloys.

The presently most promising chalcogenide is an alloy of Ge, Sb and Te ($Ge_2Sb_2Te_5$) which is already widely used for storing information in overwritable optical disks.

As indicated, for microelectronics applications, the interesting parameter is resistivity that varies of two or more orders of magnitude when the material transforms from the amorphous phase (more resistive) to the crystalline phase (more conductive) and vice versa. Furthermore, in the amorphous state, the resistivity depends heavily from temperature, with resistivity changes of one order of magnitude every 100° C., with a similar behavior to P-type semiconductors.

Phase change may be obtained by locally increasing the temperature. Under 150° C., both phases are stable. Over 200° C., nucleation of crystallites is fast and if the material is kept to the crystallization temperature for a sufficient time, it changes phase and becomes crystalline. In order to change the phase back to the amorphous state, the chalcogenide temperature is brought over the melting point (about 600° C.) and rapidly reduced.

From an electrical point of view, it is possible to reach both critical temperatures (crystallization and melting temperatures) using an electric current flow through a resistive electrode in contact or close proximity with the chalcogenic material and heating the material by Joule effect.

A phase-change storage element 1 based on the above is shown in FIG. 1, and comprises a resistive electrode forming a heater 2 and a chalcogenic region 3. The chalcogenic region 3 is generally in the crystalline state to allow good current flow. A portion of the chalcogenic region 3 is in direct contact with the heater 2 and forms a phase change portion 4.

By passing an electrical current of suitable value through the heater 2, it is possible to selectively heat the phase change portion 4 to the crystallization or melting temperatures and cause a phase change.

FIG. 2 shows the plots of the required temperature versus time when a phase change from the crystalline to the amorphous state is desired (curve A) and a phase change from the amorphous to the crystalline state is desired (curve B). $T_m$ indicates the melting temperature and $T_x$ indicates the temperature at which crystallization begins. As shown, amorphization requires a short time (reset pulse) but a high temperature; furthermore the material should be cooled in a very short time (t1) to maintain the atomic disorder and avoid recrystallization of the material. Crystallization requires a longer time t2 (also called set pulse) to allow nucleation and crystal growing.

The state of the chalcogenic region 3 may be read by applying a sufficiently small voltage so as not to cause a sensible heating and measuring the current passing through it. Since the current is proportional to the conductance of the chalcogenic material, it is possible to discriminate between the two states.

In practice, a phase-change storage element 1 can be considered as a resistor which conducts a different current according to its phase. In particular, the following convention is adopted: a phase-change storage element 1 is defined as "set" when, once appropriately biased, it conducts a detectable current (this condition may be associated to a logic condition "1"), and as "reset" when, in the same biasing conditions, it does not conduct current or conducts a much lower current than a cell that is set (logic condition "0").

The use of phase-change storage elements has already been proposed in memory arrays formed by a plurality of memory cells arranged in rows and columns. In order to prevent the memory cells from being affected by noise caused by adjacent memory cells, generally each memory cell comprises a phase-change storage element and a selection element, such as an MOS transistor or a diode.

For example, FIG. 3 shows a memory array 8 formed by a plurality of memory cells 10 arranged along rows and columns and connected to bit lines 11 (parallel to the columns of the memory array 8) and word lines 12 (parallel to the rows of the memory array 8).

Each memory cell 10 is formed by a memory element 15 having the basic structure of the phase-change storage element 1 of FIG. 2 and a selection element 16 formed by an NMOS transistor.

In each memory cell 10, the gate terminal of the NMOS transistor 16 is connected to the respective word line 12 having address $WL_{n-1}$, $WL_n$, . . . , the source terminal (during normal operation of the memory array 8, namely during reading or setting and resetting operations) is connected to a ground region 18, and the drain terminal is connected to a first terminal of the respective memory element 15. A second terminal of the memory element 15 is connected to a respective bit line 11 having address $BL_{n-1}$, $BL_n$, $BL_{n+1}$, . . .

In the memory array 8 it is possible to program or read a single memory cell 10 by appropriately biasing the bit line 11 and the word line 12 connected thereto. All the bit lines 11 and all the word lines 12 that are not addressed must be grounded.

In particular, for selecting the cell 10 connected to word line 12 having address $WL_{n-1}$ and bit line 11 having address $BL_{n-1}$, appropriate voltages are applied to line $BL_{n-1}$ and to line $WL_{n-1}$ to have a first voltage V1 at one terminal of the memory element 15 and a second voltage V2 at a second terminal of memory element 15.

When cell 10 is to be written, the cell is fed with a current pulse I the length and amplitude whereof depend on the set or reset operation desired. FIG. 4 shows indicatively the length and amplitude of the writing pulse $I_S$ and $I_R$ in the two cases.

Since, as above said, heating of a chalcogenic element causes a phase transition by the Joule effect, when the storage element is flown by a current, there is a strict relationship among temperature, current and material state.

In particular, FIG. 5 shows the change in resistance as a function of the temperature and current. In particular, FIG. 5 shows three curves C, D and E obtained at temperatures T1, T2 and T3, wherein T1<T2<T3. In FIG. 5, $I_{S1}$, $I_{S2}$ and $I_{S3}$ are the current values at which a cell 10 changes from the reset to the set state respectively at temperatures T1, T2, T3 and $I_{R1}$, $I_{R2}$ and $I_{R3}$ are the current values at which a cell 10 changes from the set to the reset state respectively at temperatures T1, T2, T3.

As may be seen, the resistance R of a chalcogenic element is strongly dependent on the temperature in the amorphous (reset) state (high resistance portions of the curves) and is scarcely variable along with temperature in the crystalline (set) state (low resistance portions of the curves).

Furthermore, a set operation carried out at temperature T1 requires a higher current ($I_{S1}$) than a set operation carried out at temperature T3 ($I_{S3}$). Moreover, a reset operation carried out at temperature T1 requires a higher current ($I_{R1}$) than a set operation carried out at temperature T3 ($I_{R3}$). The little difference between the maximum set current $I_{S1}$ and the minimum reset current $I_{R3}$ is however problematic, as below explained.

In the absence of any information on the temperature, in order to ensure writing of a cell in a required temperature range (thus including the minimum temperature of the range, e.g., T1), the write current $I_S$ must be set equal to the maximum value required (in the example, $I_{S1}$).

However, selecting a fixed, predetermined write current value $I_{S1}$, involves the risk that the write current is too close or even exceeds the minimum writing current to bring the cell in the reset state (here, $I_{R3}$). In presence of a high temperature, a set operation carried out with current $I_{S1}$ could even cause a reset of the cell.

Thus, the writing operation is hardly controllable.

Furthermore, if the reset current $I_R$ in the required temperature range is a fixed value, this should be selected not lower than $I_{R1}$ to ensure reset of the cell in all conditions, also at low temperature. However, the application of a high current value such as $I_{R1}$ can cause, at a high temperature, a over-resetting of the cell.

Moreover, since there is a direct proportionality between the duration of the set pulse and the amplitude of the reset pulse, using the maximum current $I_{R3}$ during the reset operation implies increasing the set time $t_S$ during the set operation. This increase would cause an unacceptable increase of the set time and thus in the requirements regarding the device writing speed.

BRIEF SUMMARY OF THE INVENTION

An embodiment of the invention provides a temperature detection circuit and method that solve the above problem.

BRIEF DESCRIPTION OF THE SEVERAL VIEWS OF THE DRAWING(S)

For the understanding of the present invention, preferred embodiments are now described, purely as a non-limitative example, with reference to the enclosed drawings, wherein.

Figure 4:
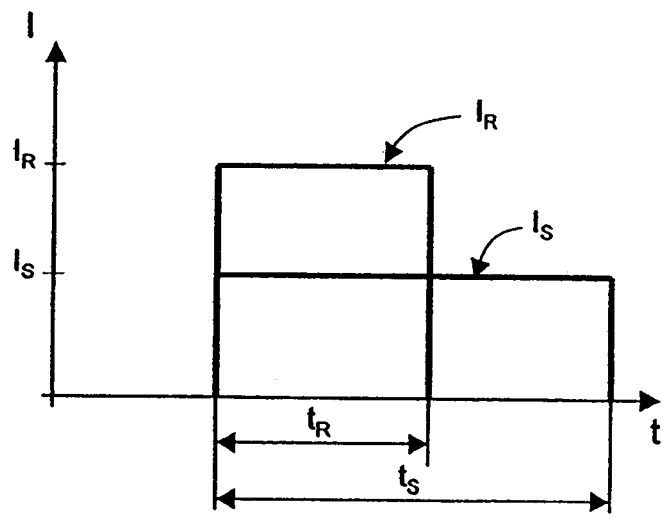
Figure 5:
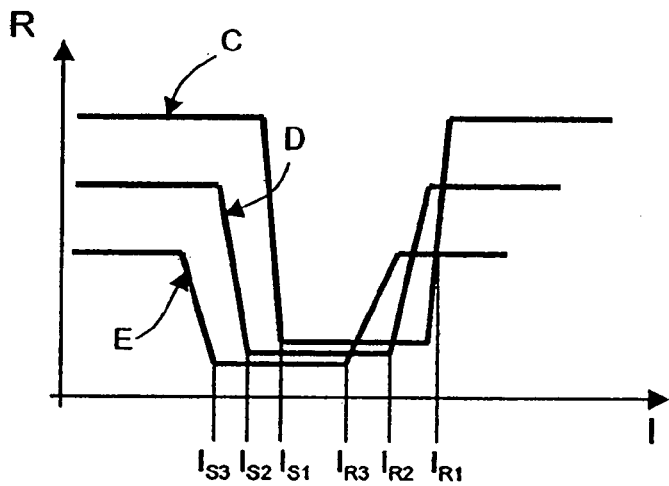
Figure 6:
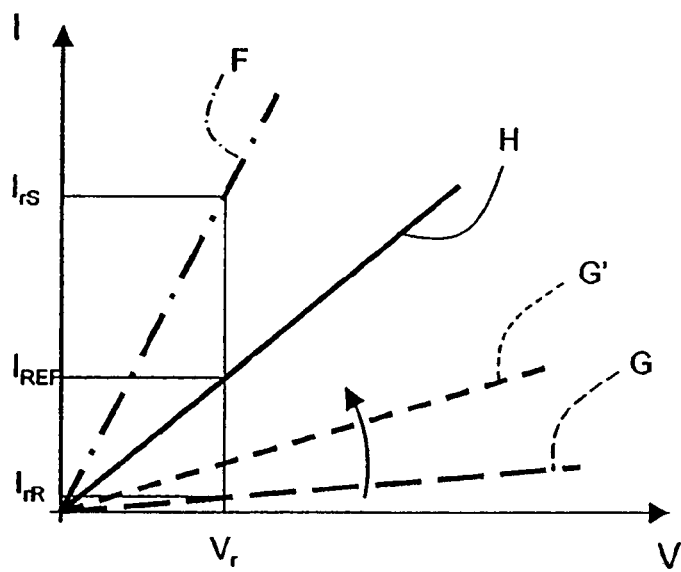
Figure 7:
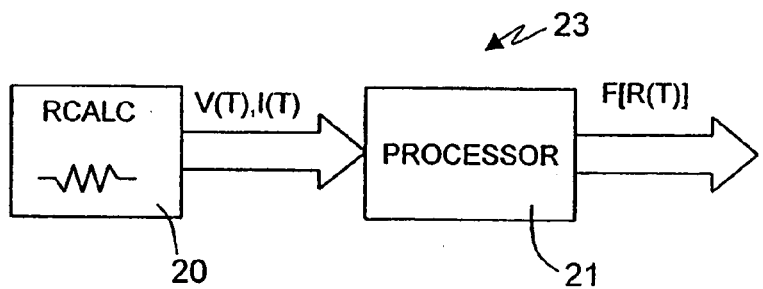
Figure 8:
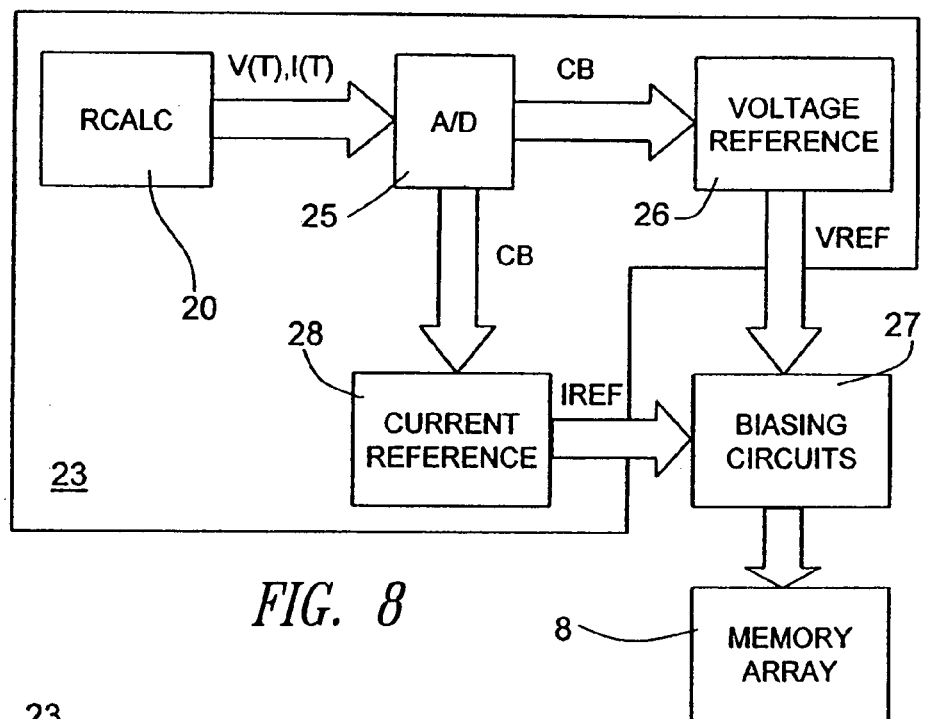
Figure 9:
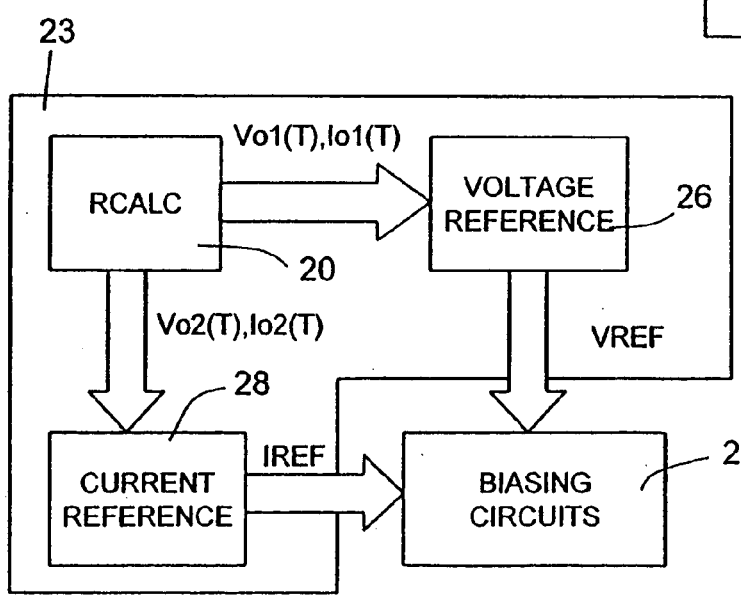
Figure 10:
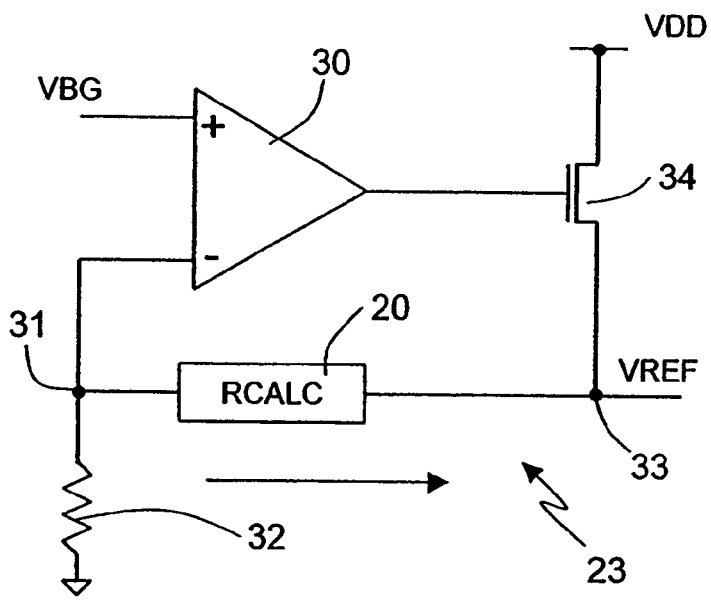
Figure 11:
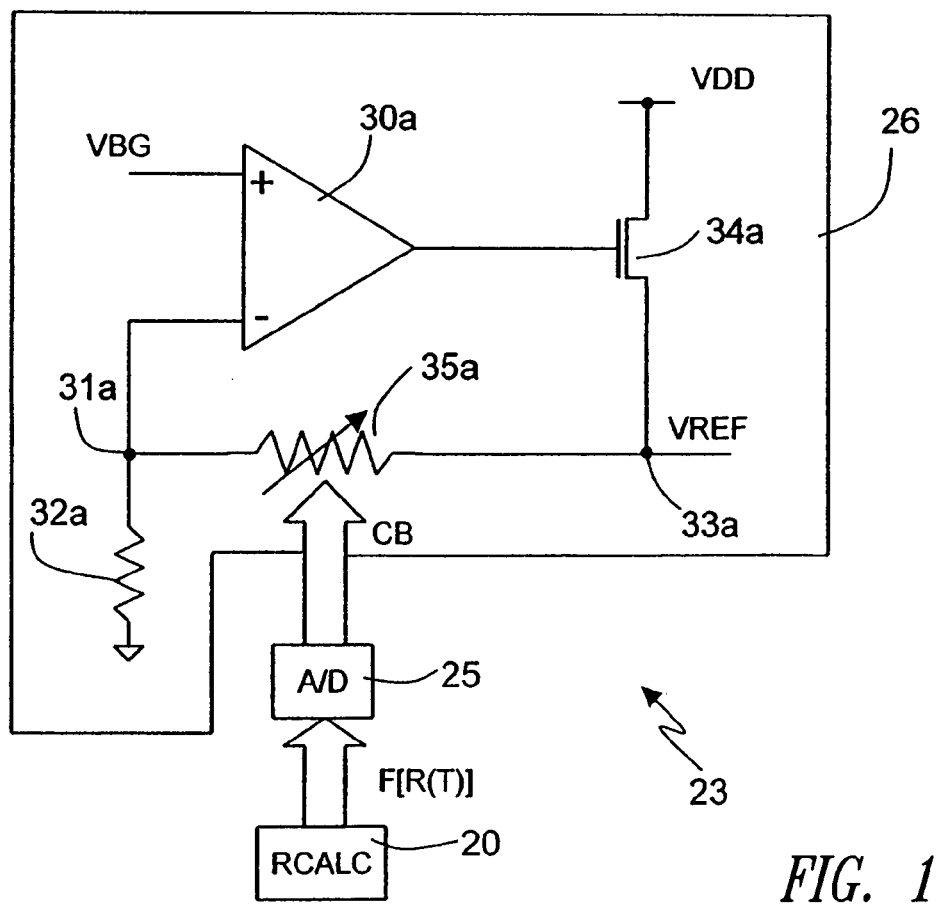
Figure 12:
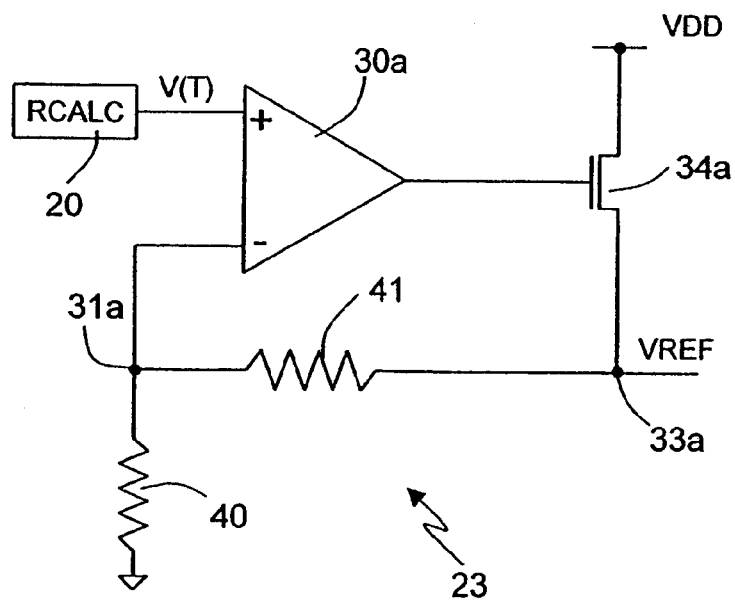
Figure 13:
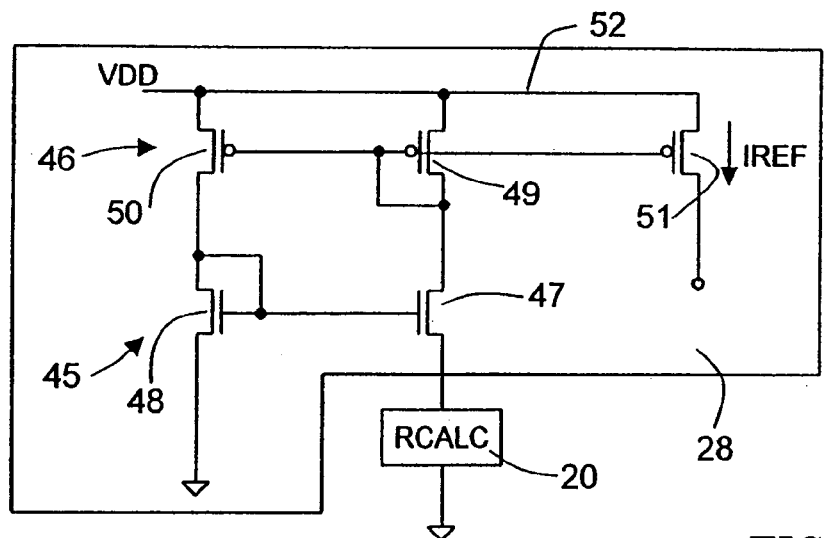
Figure 14:
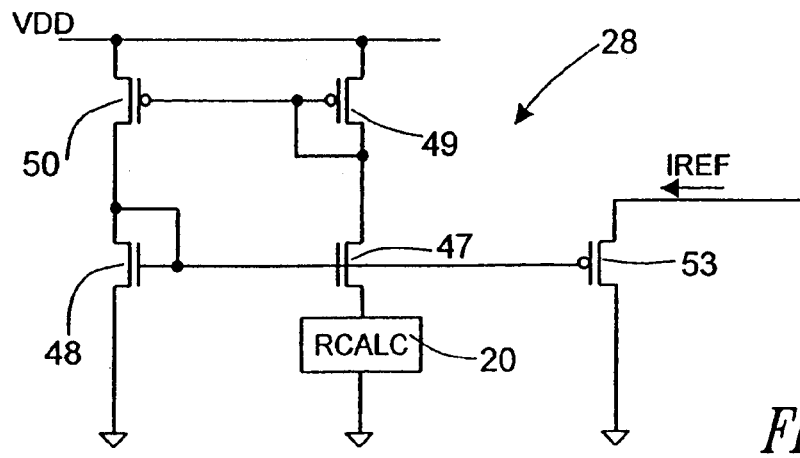
Figure 15:
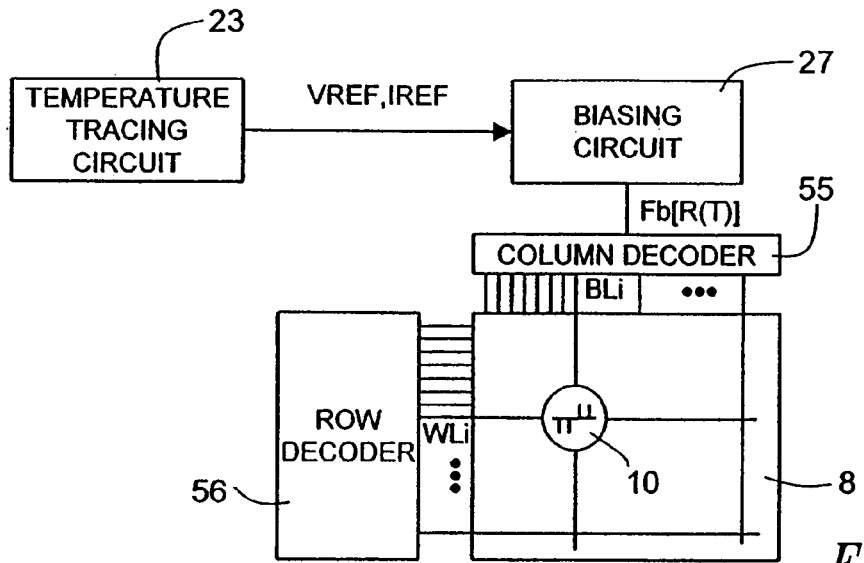
Figure 16:
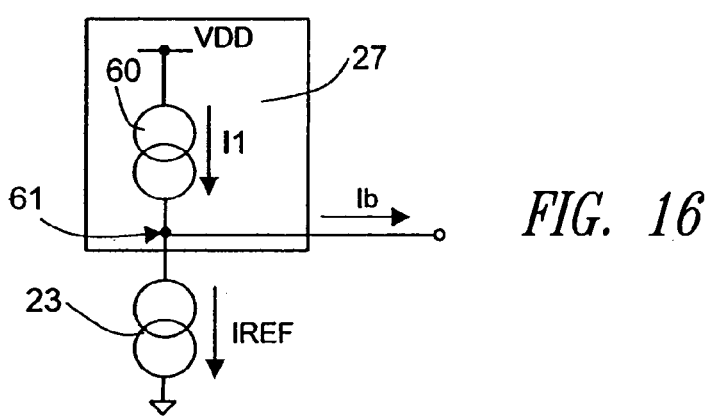
Figure 17:
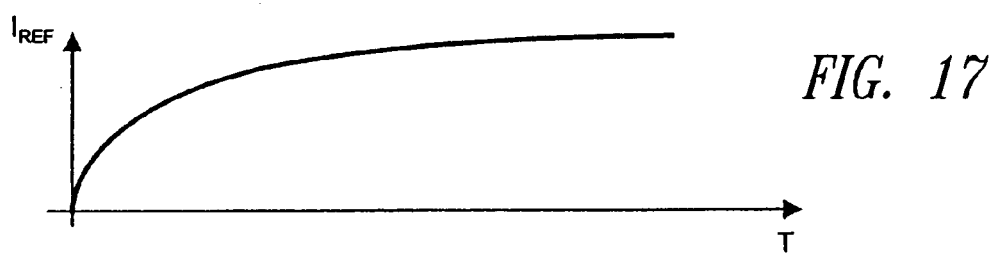
Figure 18:
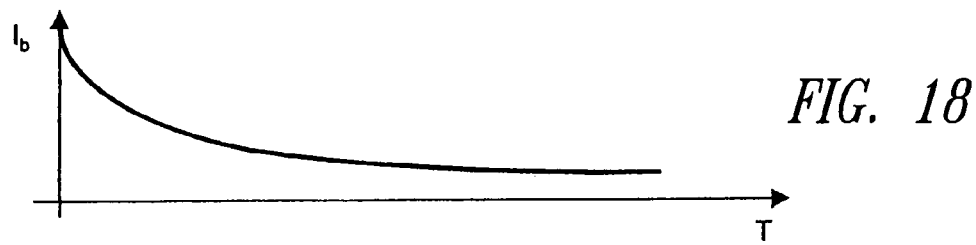
Figure 19:
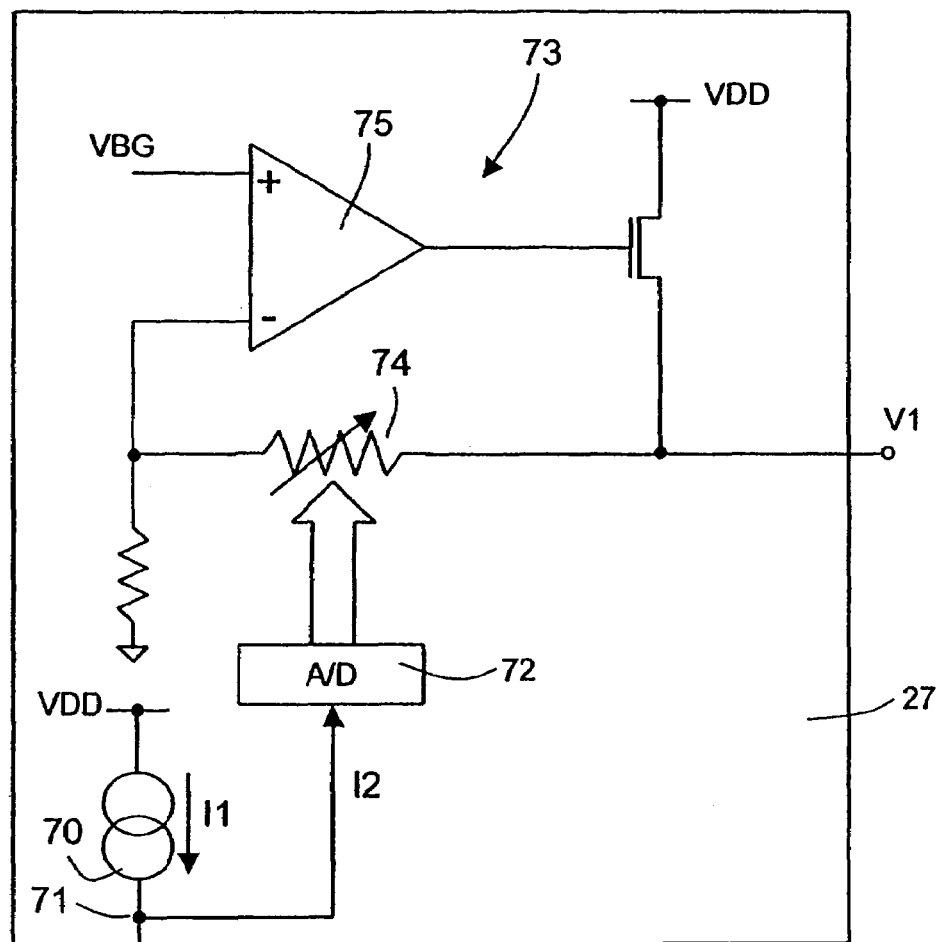
Figure 20:
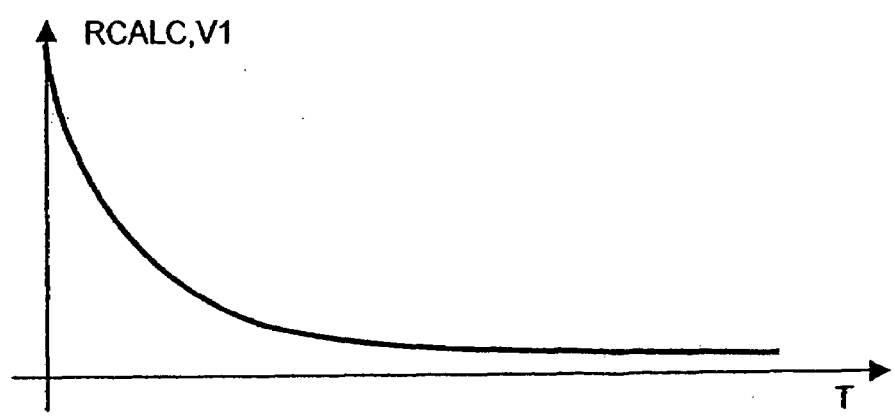

FIG. 4 plots the current pulses necessary for causing switching of the chalcogenic element;

FIG. 5 shows the switching of resistance at different current values in dependence of the temperature;

FIG. 6 shows the plot of the current versus voltage for different states of the chalcogenic element;

FIG. 7 shows a simplified block diagram of a temperature tracing circuit for phase change memory cells according to the invention;

FIG. 8 is a block diagram of a temperature tracing circuit used in a memory device for generating biasing voltages;

FIG. 9 is a block diagram of a different embodiment of a temperature tracing circuit used in a memory device for generating biasing voltages;

FIG. 10 is circuit diagram of another embodiment of the temperature tracing circuit according to the invention;

FIG. 11 is simplified diagram of an embodiment of the block diagram of FIG. 8;

FIG. 12 is simplified diagram of an embodiment of the temperature tracing circuit of FIG. 9;

FIG. 13 is circuit diagram of an embodiment of a block of the temperature tracing circuit of FIG. 9;

FIG. 14 is circuit diagram of another embodiment of the block of FIG. 13;

FIG. 15 is a simplified block diagram of a memory device incorporating a temperature tracing circuit according to the invention;

FIG. 16 is a simplified circuit diagram of a biasing circuit incorporated in the memory device of FIG. 15;

FIGS. 17 and 18 show the current-versus-temperature plots for the biasing circuit of FIG. 16;

FIG. 19 is a simplified circuit diagram of a biasing circuit incorporated in the memory device of FIG. 15; and FIG. 20 shows the voltage-versus-temperature plot for the biasing circuit of FIG. 19.

DETAILED DESCRIPTION OF THE INVENTION

In view of the above, the applicants have discovered that writing should employ a system responsible to the existing temperature; specifically, it is desired a reference that is able to trace the setting and resetting currents as a function of the existing temperature. Thereby, the resistivity values at the end of writing do not depend on the room temperature but only on the energy furnished to the chalcogenic material during writing, thus allowing a precise writing.

The information about the room temperature is important also during reading, as below explained. Reading may be carried out by setting voltages V1 and V2 applied to the terminals of the cell 10 (FIG. 3) and detecting the current I flowing in the cell. The current I flowing in the cell is given by:

$$I=(V1-V2)/R(T)$$

Neglecting the influence of the heater 2 on the resistance variations, since the heater 2 is of an alloy, such as TiSiN, having low temperature coefficient, if V1 and V2 are constant with the temperature, the current I depends on the resistance with a law of inverse proportionality and thus on the temperature in a directly proportional way.

However, as above indicated, the resistivity of chalcogenic materials decreases with an inverse proportionality law with the temperature, modifying the electrical features of the cells.

FIG. 6 shows indicatively the plots of the current versus voltage in case of a set cell (curve F) and of a reset cell (curve G) at a nominal temperature, e.g., 25° C. FIG. 6 also shows the plot of a reference line (curve H), intermediate between the set and reset curves F, G, that may be used as a reference during reading to discriminate the set or reset state of a cell. Vr=V1−V2 is the reading voltage applied across the cell; IrS is the current read at the reading voltage Vr for a set cell; IrR is the current read at the reading voltage Vr for a reset cell and IREF is the reference current at the reading voltage Vr.

FIG. 6 also shows a shifted reset shift curve G' for a reset cell in case of temperature increase (corresponding, as above discussed, to a resistance decrease).

If a cell is read at the fixed predetermined reading voltage Vr using a fixed current IREF (which means that the reference curve H is maintained fixed), the shifted reset curve G' at high temperature approaches the reference curve H, causing a strong reduction in the absolute current difference |IREF−IrR|.

The set curve F has an opposite, although less pronounced, behavior and, at high temperature, it approaches the reference curve H, also causing a reduction in the absolute current difference |IREF−IrS|.

The reduction in the current differences |IREF−IrR| and |IREF−IrS| thus reduces the security margin necessary to correctly discriminate the content of the cell and thus causes a reduction in robustness and reliability and increases reading time of the memory device.

Therefore, also the reading operation requires an information on the temperature; in particular a system is desired which has a sufficient sensing margin for all operating temperatures so as to have electrical quantities fitted to the existing temperature conditions.

Similar considerations are applicable if the cell is read by forcing a preset current value in the cell and then reading the voltage drop V1−V2 or one between V1, V2.

One embodiment of the invention resides in providing voltage or current references dependent on the temperature using a temperature sensor formed by a chalcogenic element. In particular, the chalcogenic element has a resistance variable with temperature with the same law as a phase-change storage element.

To this end, the temperature sensor furnishes an electrical quantity that reproduces the relationship between the resistance of phase change memory cells and the temperature; such electrical quantity can then be processed and in case converted into digital so as to trace and modify the various electrical quantities required for writing and reading the cell to adapt the electrical quantities to the existing temperature.

Figure 1:
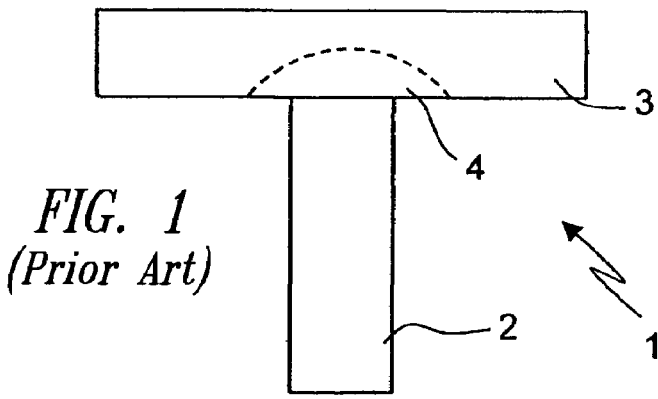
FIG. 1 shows the basic structure of a known chalcogenic element.
Figure 2:
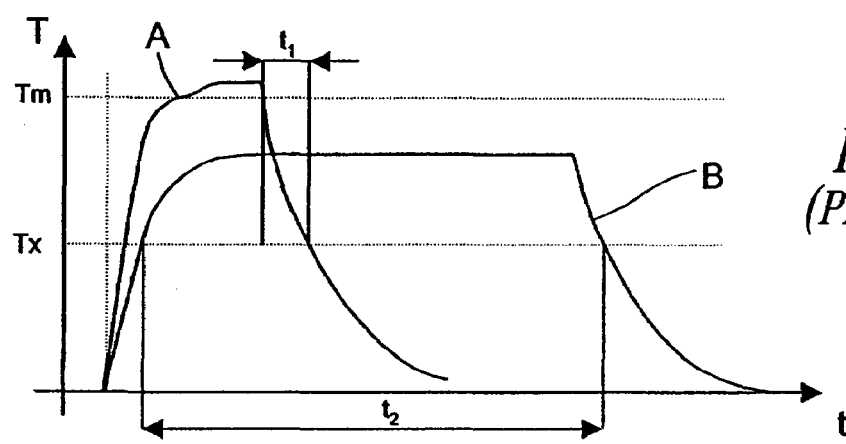
FIG. 2 illustrates the characteristic current-voltage of a phase change material.

The sensor may be formed by a network of chalcogenic elements of the type shown in FIG. 2 that should be programmed with precision (set, reset or programmed in an intermediate state) so as to furnish quantities V(T) and/or I(T) tracing with a proportional law the variations in the memory cells.

The network may comprise a plurality of chalcogenic elements connected in parallel and/or in series.

The sensor may be arranged in an area of the memory device near the array, so as to undergo the same variations due to temperature as the memory cells.

A temperature tracing circuit 23 according to the invention is shown in FIG. 7, wherein a temperature sensor element is formed by a chalcogenic element having the structure shown in FIG. 2 and represented as a chalcogenic resistor 20. The chalcogenic resistor 20 generates an output quantity (output voltage V(T) or output current I(T)) variable with temperature with the same law as the memory element 15. For example, a constant current is fed to the chalcogenic resistor 20 and the voltage V(T) across the chalcogenic resistor 20 is detected. Or a constant voltage is applied to the chalcogenic resistor 20 and the current I(T) flowing through the chalcogenic resistor 20 is detected. In the alternative, the chalcogenic resistor 20 is part of a voltage or current source with any known structure.

Figure 3:
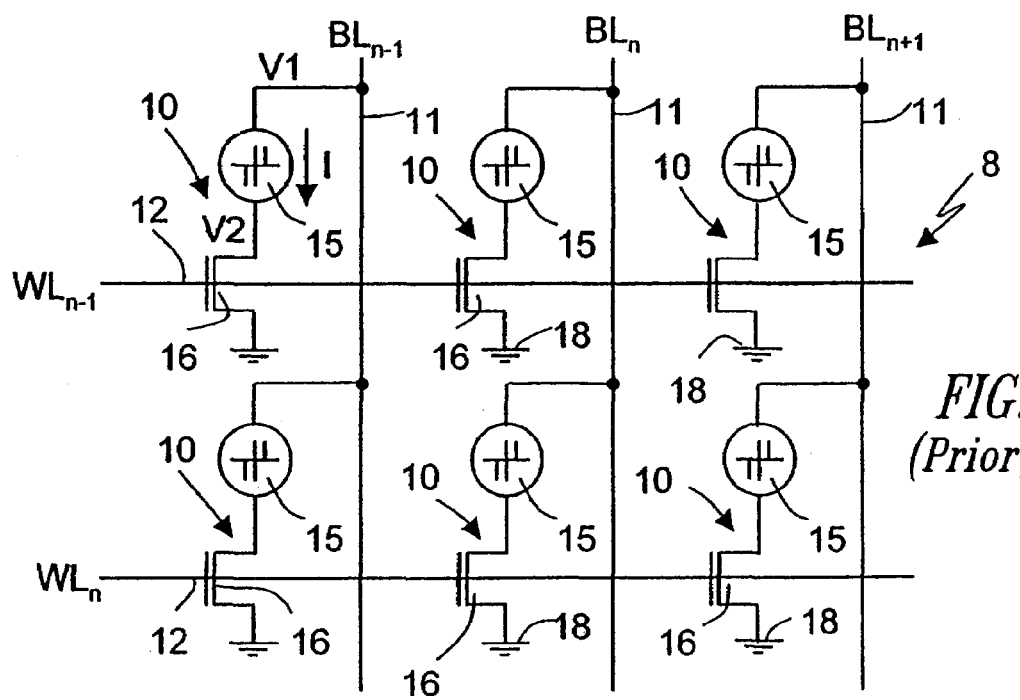
FIG. 3 shows the architecture of a memory array using the chalcogenic storage element of FIG. 1 as a PCM memory element.

The output quantity, V(T) or I(T), is fed to a processor block 21 that processes it and generates at the output an electrical quantity F[R(T)] as requested for the biasing circuitry of the memory array 8 of FIG. 3. The electrical quantity F[R(T)] is thus tracing with temperature. For example, the electrical quantity F[R(T)] may be the first voltage V1 supplied to a terminal of the memory cell 10 through a bit line $BL_i$.

FIG. 8 shows a more detailed block diagram of an embodiment of the temperature tracing circuit 23 according to the present invention.

Here, the output signal of chalcogenic resistor 20 (either a voltage V(T) or a current I(T)) is fed to an analog-to-digital converter 25 that converts the output signal V(T), I(T) into a digital string CB correlated with the existing temperature; the digital string CB is fed to a reference voltage generator 26 to configure it; the reference voltage generator 26 generates a reference voltage VREF fed to biasing circuits 27 of the memory array 8 of FIG. 3.

In addition or in the alternative, the digital string CB is fed to a reference current generator 28 to configure it; the reference current generator 28 generates a reference current IREF fed to the biasing circuits 27.

According to FIG. 9, the A/D converter 25 may be omitted; in this case, the output quantities (output voltage and/or current Vo1(T), Vo2(T), Io1(T), Io2(T) of the chalcogenic resistor 20) are directly supplied to the reference voltage generator 26 and/or the reference current generator 28.

FIG. 10 shows another embodiment of a temperature tracing circuit 23 according to the invention. Here, the temperature tracing circuit 23 is implemented by a regulator formed by an operational amplifier 30 having a non-inverting input fed with a temperature-stable voltage VBG (e.g., generated by a band-gap circuit, not shown) and an inverting input connected to an intermediate node 31. A standard resistor 32 is connected between intermediate node 31 and ground; the chalcogenic resistor 20 is connected between intermediate node 31 and an output node 33.

The output of the operational amplifier 30 drives the gate of an output transistor 34 coupled between a power supply line 35 at VDD and the output node 33.

As obvious to those skilled in the art, the voltage VREF at output node 33 is given by:

$$VREF = VBG(1 + RCALC/R)$$

wherein RCALC is the (temperature-variable) resistance of the chalcogenic resistor 20 and R is the resistance of the standard resistor 32.

Output voltage VREF increases with temperature with the same law as RCALC, neglecting the mismatch between the temperature variation of RCALC with respect to R.

In the embodiment of FIG. 10, if standard resistor 32 is exchanged with the chalcogenic resistor 20 (that is, the chalcogenic resistor 20 is coupled between the intermediate node 31 and ground and the standard resistor 32 is coupled between the intermediate node 31 and the output node 33), the reference voltage VREF is given by:

$$VREF=VBG(1+R/RCALC)$$

thus, giving rise to a relationship of inverse proportionality.

FIG. 11 shows an implementation of the temperature tracing circuit 23 of FIG. 8, wherein the reference voltage generator 26 is implemented as a regulator, with a topology similar to that of FIG. 10. In detail, the reference voltage generator 26 comprises an operational amplifier 30a receiving, at the non-inverting input, a temperature-stable voltage VBG and having the inverting input connected to an intermediate node 31a. A standard resistor 32a having a resistance R1 is connected between intermediate node 31a and ground; a controllable resistor 35a having a variable resistance R2 is connected between intermediate node 31a and the output node 33a.

The output of the operational amplifier 30a is connected to the gate of an output transistor 34a coupled between the power supply line and the output node 33a.

The resistance R2 of the controllable resistor 35a is controlled by digital string CB generated by A/D converter 25; A/D converter 25 receives an electrical quantity F[R(T)] by the chalcogenic resistor 20.

In this case, the voltage VREF at output node 33a is given by:

$$VREF=VBG(1+R2/R1)$$

wherein the value of R2, being controlled by the digital string CB, varies with temperature.

Thus, also in this case, the reference voltage VREF varies, in a first approximation, with the same law as the resistance of the chalcogenic resistor 20.

In an alternative to the embodiment of FIG. 11, the resistor coupled between intermediate node 31a and ground is variable and controlled by A/D converter 25; the feedback resistor coupled between the intermediate and the output nodes 31a, 33a is instead fixed.

FIG. 12 shows an implementation of the block diagram of FIG. 9, wherein the reference voltage generator 26 is implemented as a regulator, analogously to FIG. 11. Also here, the reference voltage generator 26 comprises an operational amplifier 30a having the non-inverting input connected to the output of the chalcogenic resistor 20 and the inverting input connected to an intermediate node 31a. A first standard resistor 40 having a resistance R1 is connected between intermediate node 31a and ground; a second standard resistor 41 having a resistance R2 is connected between intermediate node 31a and the output node 33a.

The operational amplifier 30a receives output voltage V(T) from the chalcogenic resistor 20, preferably in the reset state; as indicated above, voltage V(T) varies with temperature with the same relationship as the phase-change memory element 15 of FIG. 3. Output voltage V(T) is amplified so as to output reference voltage VREF=V(T)(1+R1/R2) that may be used as V1 to bias the bit line of a selected memory cell 15 (FIG. 3).

FIG. 13 shows an embodiment of a current generator 28, usable in the block diagram of FIG. 9.

In detail, the current generator 28, of a per se known topology, comprises a first current mirror 45 and a second current mirror 46. The first current mirror 45 includes two NMOS transistors 47, 48; NMOS transistor 47 has source terminal connected to ground through chalcogenic resistor 20; NMOS transistor 48 has shorted drain and gate terminals. The second current mirror 45 includes three PMOS transistors 49, 50, 51, whereof PMOS transistor 49 is connected between supply line 52 and the drain terminal of NMOS transistor 47; PMOS transistor 50 has shorted drain and gate terminals and is connected between supply line 52 and the drain terminal of NMOS transistor 47; PMOS transistor 51 is an output transistor and supplies reference current IREF from its drain terminal. Therefore, reference current IREF, mirroring the current flowing in the chalcogenic resistor 20 and thus having the same or a proportional amplitude (depending from the aspect ratio of the current mirrors) depends on temperature with the same law as the current flowing in the chalcogenic resistor 20.

In an alternative embodiment, shown in FIG. 14, the output transistor (now indicated at 53) is of NMOS type and is part of the first current mirror 47; in this case, PMOS transistor 51 is not provided, and the output transistor 53 draws a reference current IREF from the output.

FIG. 15 shows a block diagram of a memory device 55. As shown, the temperature tracing circuit 23, implemented according to any embodiment above discussed, supplies an output reference quantity VREF, IREF to biasing circuit 27, that generates a biasing quantity Fb[R(T)]; the biasing quantity Fb[R(T)] is then fed, through a column decoder 55, to a selected bit line BLi. A row decoder 56 generates a suitable biasing voltage on a selected word line WLi to address a selected memory cell 10.

As indicated, the electrical quantity Fb[R(T)] may be a biasing current Ib starting from reference current IREF; in this case, the temperature tracing circuit 23 may have the structure of FIG. 9, including the chalcogenic resistor 20 and the reference current generator 28. The reference current generator 28 may be implemented as shown in FIG. 14; the biasing circuit 27 may be implemented as shown in FIG. 16.

According to FIG. 16, the biasing circuit 27 comprises a constant current source 60 and a subtracting node 61. The constant current source 60, for example a band-gap current source, generates a temperature-independent current I1, fed to subtracting node 61. The subtracting node 61 also receives the reference current IREF supplied by the temperature tracing circuit 23 (shown as a current source, for sake of simplicity) and outputs a biasing current Ib given by:

$$Ib=I1-IREF$$

Since the reference current IREF increases with temperature, as shown in the plot of FIG. 17, the biasing current Ib generated by the biasing circuit 27 is inversely proportional to the temperature, as visible from FIG. 18.

Therefore, with reference again to FIG. 15, biasing current Ib is fed, by the column decoder 55, to a selected bit line BLi to allow a write operation. In this way, the memory cell 10 to be written is fed with a writing current (set or reset current $I_S$ or $I_R$) that is variable with temperature in an inverse law, to take into account the different needed set and reset current, as discussed in detail with reference to FIG. 5. Furthermore, by varying the temperature-independent current I1 depending of the specific write operation to be carried out (set or reset), it is possible to maintain constant the current gap $I_R-I_S$ independently from the existing temperature.

The biasing quantity Fb[R(T)] in FIG. 15 may also be a voltage, in particular voltage V1 of FIG. 3, starting from reference current IREF; also in this case, the temperature tracing circuit 23 may have the structure of FIG. 9, including the chalcogenic resistor 20 and the reference current generator 28, and the reference current generator 28 may be implemented as shown in FIG. 14. Here, the biasing circuit 27 may be implemented as shown in FIG. 19.

According to FIG. 19, the biasing circuit 27 comprises a constant current source 70, a subtracting node 71, an A/D converter 72 and a voltage regulator 73.

The constant current source 70, for example a band-gap current source, generates a temperature-independent current I1, fed to subtracting node 71. The subtracting node 71 further receives the reference current IREF from the temperature tracing circuit 23 (also here, shown as a current source) and outputs a control current I2 given by:

$$I2=I1-IREF$$

Control current I2 is fed to A/D converter 72 that generates a digital string CB used to control a variable resistor 74 of the regulator 73. Here the regulator 73 has the same structure shown in FIG. 11, thus the variable resistor 74 is a feedback resistor of an operational amplifier 75. Therefore, analogously to FIG. 11, the output voltage of regulator 73, biasing voltage V1, varies with temperature with a behavior similar to the chalcogenic resistor 20, as shown in FIG. 20.

Biasing voltage V1 is then fed, by the column decoder 55 of FIG. 15, to a selected bit line BLi to allow a write operation of the selected memory cell 10.

During reading, a fixed biasing voltage V1 is applied to a cell 10 to be read (FIG. 3) and the current I flowing in the cell is compared with a reference current IREF tracing in temperature, generated e.g., by reference current generator 28 of FIG. 14 and using a resetted chalcogenic resistor 20. Thereby, the reference current IREF has a variation with temperature similar to that of a resetted cell, biased by a constant voltage, and the difference |IREF−IrS| is kept practically constant. According to this solution, the reference current IREF follows the behavior of the cells that undergo a higher change with temperature (resetted cells) instead of the behavior of setted cells, whose resistance varies less with temperature, thus ensuring only a small reduction in the sense margin with temperature.

The described embodiments have the following advantages. The temperature tracing circuits using a chalcogenic resistor with the same structure as the memory elements 15 of the array supply reference voltage or reference current signals VREF, IREF that vary with temperature with directly proportional or inversely proportional relationship to the memory elements 15. A suitable processing of the reference voltage VREF or reference current IREF allows to select writing currents such as to maintain constant the writing current gap $I_R-I_S$. Thus writing is much more controllable and there is no more the risk that the set current be too narrow to the reset current.

Since the biasing voltages supplied to the memory array are fittedly correlated to the temperature (room temperature during writing), only the necessary energy is supplied for obtaining predetermined set or reset resistances, referred to the standard temperature of 27° C.; thereby the distributions of the resistances in the set and reset state are narrower for memories of big dimensions (multimegabit).

By virtue of the described technique, the reduction in the safe margin for sensing is small, as above discussed, so that the memory device is more robust, more reliable and requires lower reading times.

The chalcogenic material has a high response speed following temperature changes, with quicker thermal transients than electrical transients; thus it is possible to have temperature sensors operating in real time.

It is clear that numerous variations and modifications may be made to the circuit and method described and illustrated herein, all falling within the scope of the invention as defined in the attached claims.

In particular, it is stressed that a chalcogenic element may be used for temperature tracing also in electronic devices of different type, e.g., in sensing circuits and other type memories that require detection of temperature and regulation of any quantity based on the local temperature of the device and already include a chalcogenic material element.

What is claimed is:

1. An electronic device comprising:
an element of chalcogenic material;
a control circuit coupled to chalcogenic element; and
a temperature detection circuit coupled to the control circuit, the temperature detection circuit including a sense resistor of chalcogenic material and being structured to control the control circuit based on a temperature sensed by the sense resistor.

2. A device according to claim 1, wherein said element of chalcogenic material is a phase change storage element and said device is a phase change non-volatile memory device.

3. A device according to claim 2, wherein said sense resistor of chalcogenic material and said phase change storage element have the same structure.

4. A device according to claim 1, wherein said sense resistor of chalcogenic material generates an electrical quantity tracing with the temperature, the device further comprising a processor receiving said electrical quantity and generating a reference quantity tracing with temperature, and passing the reference quantity to the control circuit.

5. A device according to claim 4, wherein said processor comprises an analog-to-digital converter receiving said electrical quantity and generating a digital word correlated to temperature and a reference quantity generator receiving said digital word and generating said reference quantity.

6. A device according to claim 5, wherein said reference quantity generator is a voltage regulator having a control input receiving said digital word.

7. A device according to claim 6, wherein said voltage regulator comprises an operational amplifier having an input and an output and a feedback resistive network connected between said input and said output of said operational amplifier; said resistive network comprising a controllable resistor having a control input receiving said digital word.

8. A device according to claim 4, wherein said processor comprises a voltage regulator.

9. A device according to claim 8, wherein said voltage regulator comprises an operational amplifier having a first and a second input and an output and a feedback resistive network connected between said first input and said output of said operational amplifier, said second input of said operational amplifier being connected to said sense resistor of chalcogenic material.

10. A device according to claim 4, wherein said processor comprises a current source.

11. A device according to claim 4 wherein the chalcogenic element is a phase change storage element and the control circuit is a biasing circuit receiving said reference quantity and generating a biasing quantity for said phase change storage element.

12. A device according to claim 11, further comprising a write selection circuit connecting said control circuit to said phase change storage element to supply said phase change storage element with a current pulse having an amplitude that varies with the temperature.

13. A device according to claim 1, wherein said temperature detection circuit comprises an operational amplifier having an input and an output and a feedback resistive network connected between said input and said output of said operational amplifier; said resistive network including said sense resistor of chalcogenic material.

14. A device according to claim 1 wherein said element of chalcogenic material is a phase change storage element, said device is a phase change non-volatile memory device, and the control circuit is a read circuit for reading the storage element by comparing a reference quantity tracing with the sensed temperature to a read quantity that reflects a logical status of the storage element.

15. A method for tracing temperature in an electronic device including an element of chalcogenic material, the method comprising:
    detecting an existing temperature through a sense resistor of chalcogenic material; and
    controlling the chalcogenic element based on the temperature detected by the sense resistor.

16. A method according to claim 15, wherein said electronic device comprises a phase change storage element that includes the chalcogenic element.

17. A method according to claim 16, wherein the phase change storage device is a non-volatile memory, further comprising the steps of:
    generating an electrical quantity tracing with temperature; and
    processing said electrical quantity to generate a reference quantity tracing with temperature.

18. A method according to claim 17, wherein said step of generating comprises generating one between a reference voltage and a reference current.

19. A method according to claim 18, wherein the controlling step includes:
    generating a write biasing current correlated to said reference current; and
    supplying said write biasing current to said phase change memory cell.

20. A method according to claim 18, wherein the controlling step includes:
    generating a read biasing current correlated to said reference current; and
    supplying said read biasing current to said phase change memory cell.

21. A method according to claim 16 wherein the controlling step includes reading the storage element by:
    receiving from the storage element an electrical read quantity that reflects a logical status of the storage element;
    generating an electrical reference quantity that depends on the temperature detected by the sense resistor; and
    comparing the electrical read quantity to the electrical reference quantity to determine the logical status of the storage element.

22. A memory device, comprising:
    a memory array of phase-change memory elements each including a chalcogenic element;
    a control circuit coupled to the memory array; and
    a temperature detection circuit coupled to the control circuit, the temperature detection circuit including a sense resistor of chalcogenic material and being structured to control the control circuit based on a temperature sensed by the sense resistor.

23. The memory device of claim 22 wherein the sense resistor and each memory element have substantially the same structure.

24. The memory device of claim 22, wherein the sense resistor generates an electrical quantity tracing with the temperature, the device further comprising a processor receiving the electrical quantity and generating a reference quantity tracing with temperature, and passing the reference quantity to the control circuit.

25. The memory device of claim 24, wherein the processor comprises an analog-to-digital converter receiving the electrical quantity and generating a digital word correlated to temperature and a reference quantity generator receiving the digital word and generating the reference quantity.

26. The memory device of claim 24, wherein the processor includes a voltage regulator that generates the reference quantity.

27. The memory device of claim 26, wherein the voltage regulator comprises an operational amplifier having an input and an output and a feedback resistive network connected between the input and the output of the operational amplifier; the resistive network comprising a controllable resistor that is controlled based on the temperature sensed by the sense resistor.

28. The memory device of claim 27 wherein the voltage regulator comprises an operational amplifier having a first and a second input and an output and a feedback resistive network connected between the first input and the output of the operational amplifier, the second input of the operational amplifier being connected to the sense resistor.

29. The memory device of claim 22, further comprising a write selection circuit connecting the biasing circuit to each of the phase change storage elements to supply the phase change storage elements with a current pulse having an amplitude that varies with the temperature.

30. The memory device of claim 22, wherein the temperature detection circuit comprises an operational amplifier having an input and an output and a feedback resistive network connected between the input and the output of the operational amplifier; the resistive network including the sense resistor.

31. The memory device of claim 22 wherein the control circuit is a read circuit for reading the storage elements by comparing a reference quantity tracing with the sensed temperature to a read quantity that reflects a logical status of one of the storage elements.

* * * * *